United States Patent [19]
Kondo

[11] Patent Number: 5,885,892
[45] Date of Patent: Mar. 23, 1999

[54] BUMPLESS METHOD OF ATTACHING INNER LEADS TO SEMICONDUCTOR INTEGRATED CIRCUITS

[75] Inventor: Toshinari Kondo, Tokyo, Japan

[73] Assignee: OKI Electric Industry Co., LTD., Tokyo, Japan

[21] Appl. No.: 790,282

[22] Filed: Jan. 28, 1997

[30] Foreign Application Priority Data

Feb. 8, 1996 [JP] Japan .................................. 8-022353
Jul. 16, 1996 [JP] Japan .................................. 8-185784

[51] Int. Cl.$^6$ .................................................. H01L 21/44
[52] U.S. Cl. ........................................... 436/615; 438/613
[58] Field of Search .................................. 437/209, 214, 437/215, 217, 219, 220; 228/110.1; 428/611, 612, 613, 614, 615, 616, 617

[56] References Cited

U.S. PATENT DOCUMENTS

| | | | |
|---|---|---|---|
| 4,209,355 | 6/1980 | Burns ....................................... | 156/630 |
| 4,534,811 | 8/1985 | Ainslie et al. ........................ | 228/110.1 |
| 4,607,779 | 8/1986 | Burns ....................................... | 228/106 |
| 4,754,912 | 7/1988 | Burns ....................................... | 228/164 |
| 4,842,662 | 6/1989 | Jacobi .................................... | 228/110.1 |
| 4,917,286 | 4/1990 | Pollacek ................................ | 228/110.1 |
| 5,059,559 | 10/1991 | Takahashi et al. ...................... | 437/220 |
| 5,142,117 | 8/1992 | Hoggatt et al. ........................ | 228/110.1 |
| 5,142,450 | 8/1992 | Olson et al. ............................... | 437/220 |
| 5,358,906 | 10/1994 | Lee .......................................... | 437/220 |
| 5,403,785 | 4/1995 | Arai et al. ................................ | 437/220 |
| 5,487,999 | 1/1996 | Farnworth .................................... | 437/8 |

FOREIGN PATENT DOCUMENTS

| | | |
|---|---|---|
| 19504543A1 | 8/1996 | Germany . |
| 59269913 | 12/1984 | Japan . |
| 5-109969 | 4/1993 | Japan .................................. 228/110.1 |
| 2187331 | 2/1987 | United Kingdom . |

OTHER PUBLICATIONS

"High Strength Thermocompression Bonds," *IBM Technical Disclosure Bulletin*, 30, No. 7, pp. 208–209 (Dec. 1987).
"No–Bump Beam Tape," *IBM Technical Disclosure Bulletin*, vol. 25, No. 4, pp. 1948–1949 (Sep. 1982).

*Primary Examiner*—Kevin M. Picardat
*Attorney, Agent, or Firm*—Venable; Robert J. Frank; Julie A. Petruzzelli

[57] ABSTRACT

A method of attaching inner leads to the metal electrodes of an integrated-circuit die, in which the tips of the inner leads are pressed onto the metal electrodes by a heated bonding tool. The heat of the bonding tool softens the tips of the inner leads, enabling the inner leads to be directly pressure-welded to the metal electrodes, without the need for intervening soft metal bumps.

51 Claims, 5 Drawing Sheets

BUMPLESS METHOD OF ATTACHING INNER LEADS TO SEMICONDUCTOR INTEGRATED CIRCUITS

BACKGROUND OF THE INVENTION

The present invention relates to a method of attaching inner leads to the metal electrodes of a semiconductor integrated-circuit die.

Conventional methods of inner-lead attachment employed in tape-automated bonding, for example, make use of bumps of a soft metal such as gold, which are formed on either the metal electrodes or the inner leads themselves. While these soft metal bumps facilitate the bonding of the inner leads to the electrodes, the formation of the bumps is an expensive process requiring separate equipment and extra labor, and the technology of bump-formation takes time to learn. The bump-formation process thus adds significantly to the cost of the completed semiconductor device.

SUMMARY OF THE INVENTION

It is accordingly an object of the present invention to attach inner leads to the metal electrodes of a semiconductor integrated-circuit die without requiring the formation of bumps.

The invented method presses the tips of the inner leads onto the metal electrodes with a heated bonding tool. The heat of the bonding tool softens the tips of the inner leads, so that when pressed onto the metal electrodes, they are directly pressure-welded to the metal electrodes without the need for soft metal bumps.

The invented method may comprise one or more of the additional steps of pre-softening the inner leads by annealing, roughening the surfaces of the inner leads that will be pressed against said metal electrodes, and forming mesas at the tips of the inner leads.

DETAILED DESCRIPTION OF THE INVENTION

Figure 1:
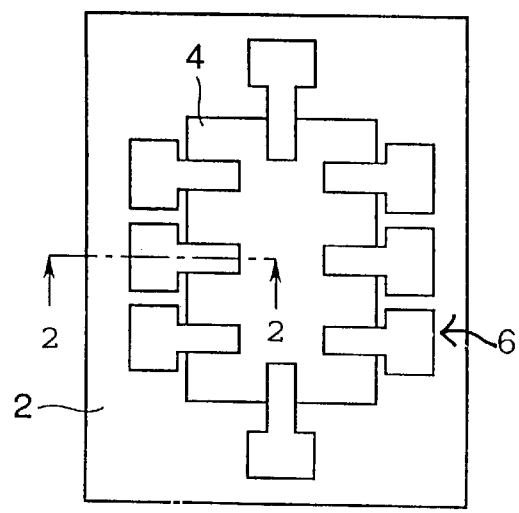
FIG. 1 is a plan view of a plastic-film lead frame with inner leads.

Embodiments of the invention will be described with reference to the attached illustrative drawings. Identical reference numerals will be used for equivalent or identical elements in different drawings.

First embodiment

Figure 2:
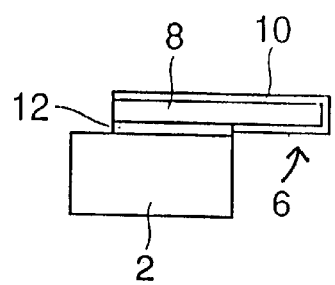
FIG. 2 is a sectional view through line 2—2 of FIG. 1.

FIG. 1 shows part of a plastic-film lead frame of the type employed in, for example, tape-automated bonding. The lead frame comprises a polyimide film 2 with a central hole 4, and a plurality of inner leads 6 that are attached to the polyimide film 2 but extend over the central hole 4. The cross-sectional structure of the frame through line 2—2 is illustrated in FIG. 2. Each inner lead 6 comprises a copper-foil core 8 approximately thirty-five micrometers (35 μm) thick, covered by gold plating 10 approximately 5 μm thick. The inner lead 6 is attached to the polyimide film 2 by an adhesive 12.

The lead frame shown in FIGS. 1 and 2 is created by spreading adhesive 12 on the polyimide film 2, using the adhesive 12 to bond a sheet of copper foil onto the entire surface of the polyimide film 2 (and so as to cover the central hole 4), patterning the copper foil to remove those portions that will not become inner leads 6, thus leaving the copper-foil cores 8 of the inner leads attached to the polyimide film 2, then gold-plating the exposed surfaces of the copper-foil cores 8, including both upper and lower surfaces. The hardness of the resulting inner leads 6 normally has a value of 110 to 120 on the Vickers hardness scale (HV).

Figure 3:
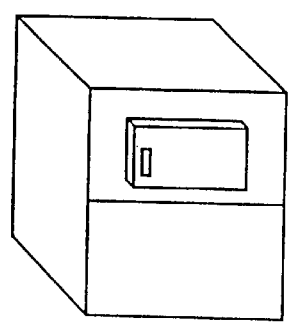
FIG. 3 is a drawing of an annealing kiln.

Before the inner leads 6 are bonded to a semiconductor integrated-circuit die (referred to below as an IC chip), the lead frame is placed in an annealing kiln of the type shown in FIG. 3, and annealed at a temperature in the range from about 200° C. to about 300° C. for approximately thirty minutes, in a reducing atmosphere such as a nitrogen atmosphere. This annealing pre-softens the inner leads 6, reducing their hardness to approximately 80 to 100 HV.

Figure 4:
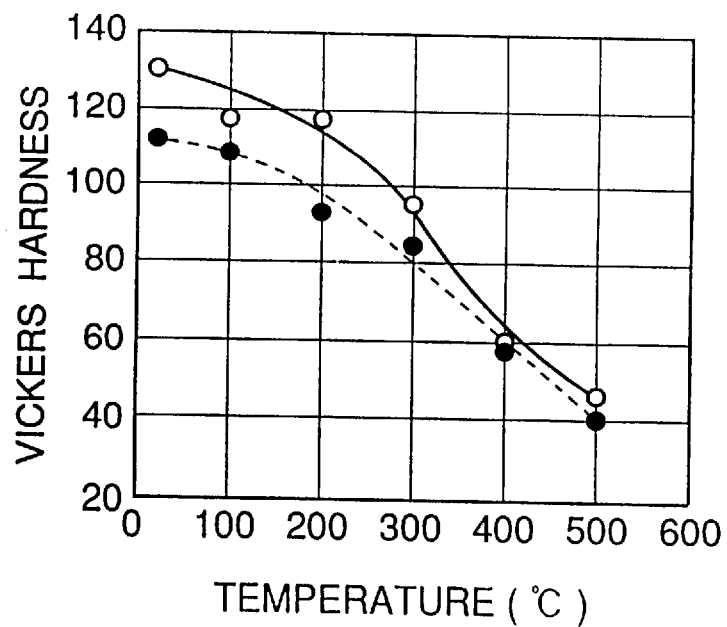
FIG. 4 is a graph illustrating the relationship between temperature and lead hardness.

The annealing temperature can be varied according to the type of copper foil employed in the inner leads. FIG. 4 illustrates the relation between annealing temperature, shown on the horizontal axis, and lead hardness, shown on the vertical axis. The white dots are data points taken for one type of copper foil commonly employed in inner leads, for which an annealing temperature of about 300° C. is appropriate. The black dots are data points for another type of copper foil commonly employed in inner leads, for which a lower annealing temperature is suitable.

Figure 5:
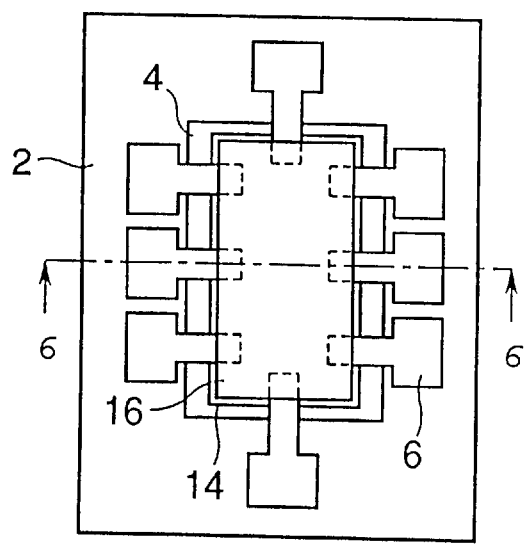
FIG. 5 is a plan view of an IC chip placed in the plastic-film lead frame preparatory to lead attachment.

Referring to FIG. 5, the lead frame is next placed in a bonding apparatus so that the annealed inner leads 6 can be bonded to an IC chip 14, which is disposed within the central hole 4. The bonding is accomplished by a bonding tool 16.

Figure 6:
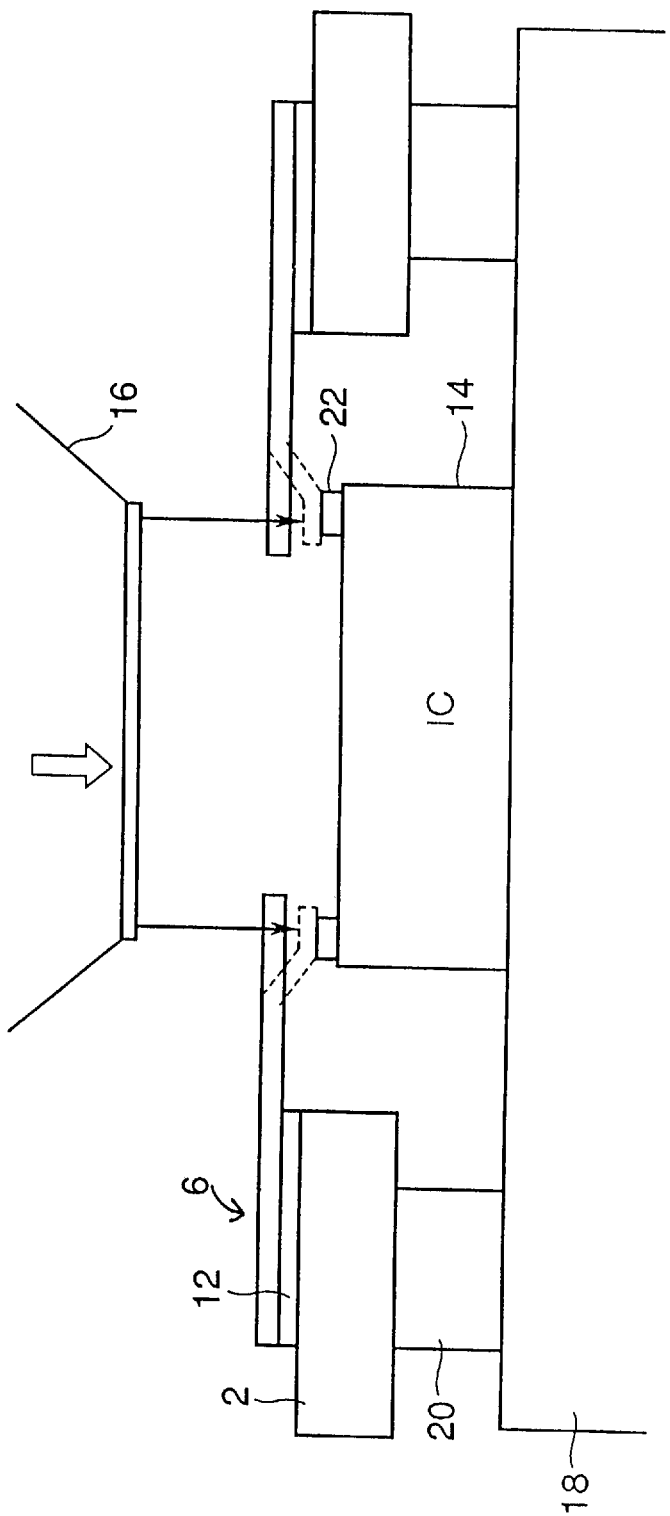
FIG. 6 is a sectional view through line 6—6 of FIG. 5, illustrating the inner-lead bonding process.

The bonding process is more clearly illustrated by the sectional view in FIG. 6. The IC chip 14 is placed on the center of a stage 18, which is heated to 100° C. The bonding tool 16, which is heated to 500° C., is positioned over the center of the stage. A clamper 20 is placed on the stage 18, and the polyimide film 2 is placed on the damper 20 and held in a position such that the tips of the inner leads 6 are directly over the aluminum electrodes 22 of the IC chip 14. The bonding tool 16 is then lowered so that it presses the tips of the inner leads 6 against the aluminum electrodes 22, while simultaneously heating the tips of the inner leads 6 to 500° C. Pressure is maintained with a force of one kilogram (1 kg) for eight tenths of a second (0.8 s). The combination of high temperature and pressure alloys the gold plating of the inner leads 6 with the aluminum of the electrodes 22, thereby pressure-welding the inner leads 6 directly to the aluminum electrodes 22.

Contact with the 500° C. bonding tool 16 softens the tips of the inner leads 6 to a hardness value of approximately 40 HV to 60 HV, as can be verified from FIG. 4. This hardness value is similar to the hardness of the gold bumps employed for inner-lead bonding in the prior art. The invented method is accordingly able to form bonds with a reliability comparable to that in the prior art, without the need for bumps. The result is a major saving in equipment and labor costs.

A further advantage of the invented method is that the bonds have a uniformly low profile, as the leads are bonded directly to the aluminum electrodes, with no raised bumps.

Second embodiment

The second embodiment of the invented method is similar to the first, except that the step of annealing the inner leads is omitted, and the temperature of the bonding tool 16 is increased to 560° C. The bonding pressure is again 1.0 kg, maintained for 0.8 s. With these temperature and time conditions, the tips of the inner leads 6 can be softened to 40 HV to 60 HV even though the initial hardness of the leads is from 110 HV to 120 HV.

The second embodiment achieves effects similar to the first embodiment, and has the additional advantage of being shorter and simpler, since the annealing step is omitted.

Third embodiment

The third embodiment is similar to the first embodiment, but comprises the additional step of roughening the under-surfaces of the inner leads 6.

Figure 7:
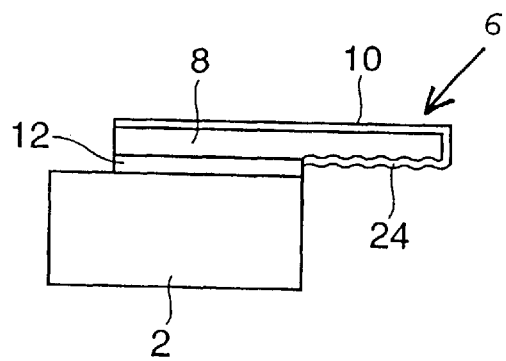
FIG. 7 is a sectional view illustrating an inner lead with a roughened surface.

The roughening is performed by etching the copper foil cores 8 of the inner leads 6 after the copper foil has been patterned, but before the leads 6 are plated with gold. The gold plating 10 is deposited on all exposed surfaces of the leads, including the roughened surfaces. FIG. 7 is a sectional view illustrating the roughened surface 24 of an inner lead 6. The roughness scale (the spacing between adjacent valleys in the roughened surface) is substantially 1.0 μm. Roughening does not alter the hardness of the inner leads 6, which remains about 110 HV to 120 HV before annealing.

The annealing and bonding steps are carried out as in the first embodiment, so a description will be omitted. The advantage of the third embodiment is that even if the aluminum electrodes 22 of the IC chip 14 are covered by a thick natural oxide layer, when the roughened surface 24 is pressed against the electrode surface, the oxide layer is readily broken through, enabling the reliable formation of an aluminum-gold alloy weld as in the first embodiment.

The third embodiment can be modified by omitting the annealing step, as in the second embodiment. The third embodiment can also be modified by roughening only parts of the under-surfaces 24 of the inner leads 6, instead of the entire under-surfaces, 24 provided the parts that make contact with the aluminum electrodes 22 are roughened.

Fourth embodiment

The fourth embodiment is similar to the first embodiment, but gives the tips of the inner leads a mesa shape, so that the inner leads can be bonded to the aluminum electrodes without exerting unwanted pressure on surrounding passivation films.

Figure 8:
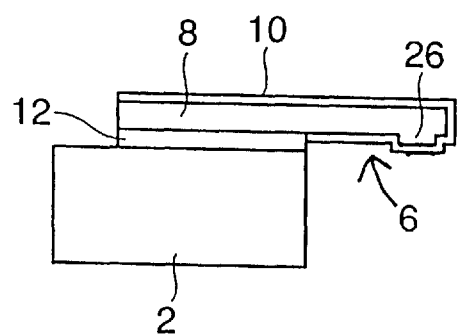
FIG. 8 is a sectional view illustrating an inner lead with a mesa surface.

FIG. 8 is a sectional view showing an inner lead 6 of the type employed in the fourth embodiment. The mesa 26 is formed after the inner leads 6 have been patterned by removing unwanted copper foil, and before the gold plating 10 is applied. The mesa 26 is formed by etching to reduce the thickness of the copper-foil core 8 in areas other than the mesa 26. The mesa may be square, round, hexagonal, diamond-shaped, or of any other shape suitable for bonding to an aluminum electrode 22. Mesa formation does not change the hardness of the inner leads 6, which remains 110 HV to 120 HV as in the first embodiment.

Figure 9:
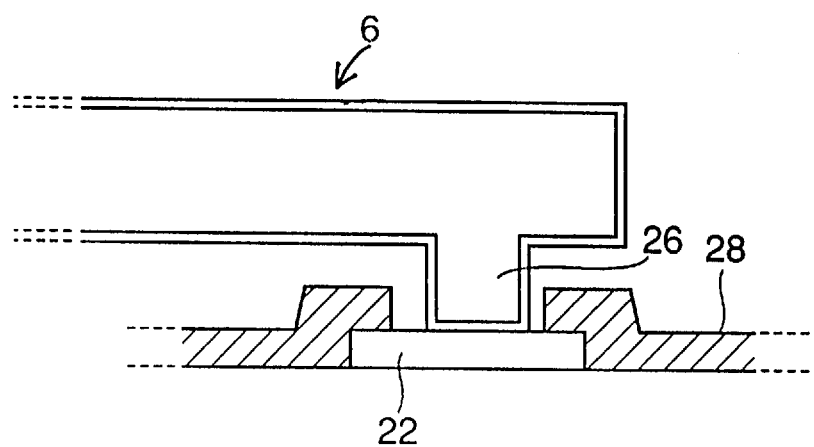
FIG. 9 is a sectional view illustrating the bonding of the inner lead in FIG. 8.

The annealing and bonding processes are carried out as described in the first embodiment. FIG. 9 illustrates the bonding of an inner lead 6 to an aluminum electrode 22 that is surrounded and partially covered by a passivation film 28. When the inner lead 6 is pressed down by the bonding tool, only the mesa 26 makes contact with the aluminum electrode 22. No part of the inner lead 6 is pressed against the passivation film 28.

The joint strength of the bond formed between the mesa 26 and aluminum electrode 22 is substantially the same as the joint strength of the bond formed in the first embodiment. The advantage of the fourth embodiment is that the passivation film 28 cannot be cracked by the pressure of bonding.

The fourth embodiment can be modified by omitting the annealing step, as in the second embodiment.

The present invention is not limited to use in tape-automated bonding, but is applicable in any bonding process in which inner leads are attached to the metal electrodes of an IC chip by pressure welding, regardless of how the inner leads themselves are formed or mounted.

The temperatures of 200° C., 300° C., 500° C., and 560° C., and Vickers hardness values of 40 HV, 60 HV, 80 HV, 100 HV, 110 HV, and 120 HV mentioned in the descriptions of the above embodiments have been given as general guides; the invention is not restricted to these exact temperatures or hardness values. When the annealing step is carried out, the annealing time is not limited to thirty minutes. The roughness scale of the roughened inner leads may be greater than 1.0 μm, and the roughening method is not limited to etching.

After inner-lead bonding, the IC chip may be individually packaged, or may become part of a multi-chip module.

Those skilled in the art will recognize that further modifications are possible within the scope claimed below.

What is claimed is:

1. A method of attaching tips of inner leads to metal electrodes of a semiconductor integrated-circuit die, without forming bumps on said tips and without forming bumps on said metal electrodes, comprising the steps of:

heating bonding tool;

annealing said inner leads to pre-soften said tips; and pressing said pre-softened tips onto said metal electrodes with said bonding tool, thereby simultaneously softening said tips by heating and pressure-welding said tips to said metal electrodes.

2. The method of claim 1, comprising the additional step of roughening certain surfaces of said inner leads before said step of pressing, the surfaces thus roughened comprising the surfaces that will be pressed against said metal electrodes in said step of pressing.

3. The method of claim 1, comprising the additional step of processing said inner leads to form mesas at the tips of said inner leads, wherein said mesas are pressed against said metal electrodes in said step of pressing.

4. A method of attaching the tips of inner leads made of gold-plated copper foil to aluminum electrodes of a semiconductor integrated-circuit die, without forming bumps on said tips, and without forming bumps on said aluminum electrodes, comprising the steps of:

heating a bonding tool to a temperature of at least 400° C.:

annealing said inner leads in a reducing atmosphere to pre-soften said inner leads; and pressing the tips of said pre-softened inner leads onto said aluminum electrodes with said bonding tool, thereby simultaneously softening said tips by heating and pressure-welding said tips to said aluminum electrodes.

5. The method of claim 4, wherein said temperature is sufficiently high that the tips of said inner leads are softened to a Vickers hardness value not exceeding sixty during said step of pressing.

6. The method of claim 5, wherein said temperature is not so high that the tips of said inner leads are softened to a Vickers hardness value of less than forty during said step of pressing.

7. The method of claim 4, wherein said temperature is at least 520° C. but not more than 600° C.

8. The method of claim 4, wherein said step of annealing is carried out at a temperature of at least 150° C. but not more than 350° C.

9. The method of claim 4, wherein said step of heating heats said bonding tool to a temperature of at least 460° C. but not more than 540° C.

10. The method of claim 4, comprising the additional step of roughening certain surfaces of said inner leads before said step of annealing, the surfaces thus roughened comprising the surfaces that will be pressed against said aluminum electrodes in said step of pressing.

11. The method of claim 10, wherein said step of roughing creates a roughened surface with a roughness scale of at least 0.5 micrometer.

12. The method of claim 11, wherein said step of roughening creates a roughened surface with a roughness scale not exceeding ten micrometers.

13. The method of claim 10, wherein said step of roughening is carried out by roughening said copper foil before said copper foil is gold-plated.

14. The method of claim 4, comprising the additional step of processing said inner leads to form mesas at the tips of said inner leads, wherein said mesas are pressed against said metal electrodes in said step of pressing.

15. The method of claim 14, wherein said step of processing comprises etching said inner leads to form said mesas.

16. The method of claim 14, wherein said step of processing is carried out by etching said copper foil before said copper foil is gold-plated.

17. The method of claim 4, wherein said step of pressing is carried out with a pressing force of at least one-half of one kilogram.

18. The method of claim 17, wherein said pressing force does not exceed two kilograms.

19. The method of claim 18, wherein said pressing force is maintained for at least four-tenths of one second.

20. The method of claim 19, wherein said pressing force is maintained for a time not exceeding 1.6 seconds.

21. A method of attaching tips of inner leads to metal electrodes of a semiconductor integrated circuit chip, comprising the steps of:

softening the tips of said inner leads in a reducing atmosphere; and pressing said softened tips of said inner leads onto said metal electrodes with a heated bonding tool.

22. The method of claim 21, wherein said inner leads comprise copper covered by gold plating.

23. The method of claim 21, wherein, in said step of pressing, said bonding tool is heated to a temperature of at least 400° C.

24. The method of claim 21, wherein, in said step of pressing, said bonding tool is heated to a temperature sufficiently high that said tips of said inner leads are softened to a Vickers hardness value not exceeding sixty.

25. The method of claim 24, wherein said temperature is not so high that the tips of said inner leads are softened to a Vickers hardness value of less than forty.

26. The method of claim 24, wherein said bonding tool is heated to a temperature of at least 520° C. but not more than 600° C.

27. The method of claim 21, wherein, said step of softening is carried out at a temperature of at least 150° C. but not more than 350° C.

28. The method of claim 21, wherein, in said step of pressing, said bonding tool is heated to a temperature of at least 460° C. but not more than 540° C.

29. The method of claim 21, comprising the additional step of roughening certain surfaces of said inner leads before said step of pressing, the surfaces thus roughened comprising the surfaces that will be pressed against said metal electrodes in said step of pressing.

30. The method of claim 29, wherein said step of roughing creates a roughened surface with a roughness scale of at least 0.5 micrometer.

31. The method of claim 30, wherein said step of roughening creates a roughened surface with a roughness scale not exceeding ten micrometers.

32. The method of claim 21, comprising the additional step of processing said inner leads to form mesas at the tips of said inner leads, wherein said mesas are pressed against said metal electrodes in said step of pressing.

33. The method of claim 21, wherein said step of pressing is carried out with a pressing force of at least one-half of one kilogram.

34. The method of claim 33, wherein said pressing force does not exceed two kilograms.

35. The method of claim 34, wherein said pressing force is maintained for at least four-tenths of one second.

36. The method of claim 35, wherein said pressing force is maintained for a time not exceeding 1.6 seconds.

37. A method of attaching tips of inner leads to electrodes of a semiconductor integrated circuit chip, comprising the steps of:

annealing the tips of said inner leads to soften the tips thereof: and pressing said softened tips onto said electrodes with a bonding tool.

38. The method of claim 37, wherein said inner leads comprise copper covered by gold plating.

39. The method of claim 37 wherein, in said step of pressing, said bonding tool is heated to a temperature of at least 400° C.

40. The method of claim 37 wherein, in said step of pressing, said bonding tool is heated to a temperature sufficiently high that the tips of said inner leads are softened to a Vickers hardness value not exceeding sixty.

41. The method of claim 40, wherein said temperature is not so high that the tips of said inner leads are softened to a Vickers hardness value of less than forty.

42. The method of claim 37, wherein said step of annealing is carried out at a temperature of at least 150° C but not more than 350° C.

43. The method of claim 37 wherein, in said step of pressing, said bonding tool is heated to a temperature of at least 460° C. but not more than 540° C.

44. The method of claim 37, comprising the additional step of roughening selected surfaces of said inner leads before said step of softening, said roughened surfaces being pressed against said electrodes in said step of pressing.

45. The method of claim 44, wherein said step of roughening creates a roughened surface with a roughness scale of at least 0.5 micrometer.

46. The method of claim 44, wherein said step of roughening creates a roughened surface with a roughness scale not exceeding ten micrometers.

47. The method of claim 37, comprising the additional step of processing said inner leads to form mesas at the tips of said inner leads, wherein said mesas are pressed against said electrodes in said step of pressing.

48. The method of claim 37, wherein said step of pressing is carried out with a pressing force of at least one-half of one kilogram.

49. The method of claim 48, wherein said pressing force does not exceed two kilograms.

50. The method claim 48, wherein said pressing force is maintained for at least four-tenths of one second.

51. The method of claim 50, wherein said pressing force is maintained for a time not exceeding 1.6 seconds.

* * * * *